United States Patent
Cha et al.

(10) Patent No.: US 9,577,255 B2
(45) Date of Patent: Feb. 21, 2017

(54) NEGATIVE ELECTRODE ACTIVE MATERIAL FOR NON-AQUEOUS ELECTROLYTE RECHARGEABLE BATTERY, METHOD OF FABRICATING THE SAME, AND NON-AQUEOUS ELECTROLYTE RECHARGEABLE BATTERY INCLUDING THE SAME

(71) Applicant: Dae Joo Electronic Materials Co., Ltd., Gyeonggi-do (KR)

(72) Inventors: Woo Byoung Cha, Gyeonggi-do (KR); Sung Soo Kim, Gyeonggi-do (KR); Seung Min Oh, Incheon (KR); Ki Young Kim, Gyeonggi-do (KR)

(73) Assignee: DAE JOO ELECTRONIC MATERIALS CO., LTD, Gyeonggi-Do (KR)

( * ) Notice: Subject to any disclaimer, the term of this patent is extended or adjusted under 35 U.S.C. 154(b) by 0 days.

(21) Appl. No.: 14/665,606

(22) Filed: Mar. 23, 2015

(65) Prior Publication Data

US 2016/0190572 A1    Jun. 30, 2016

(30) Foreign Application Priority Data

Dec. 31, 2014    (KR) ........................ 10-2014-0195934

(51) Int. Cl.
*H01M 4/134*    (2010.01)
*H01M 4/48*    (2010.01)
*H01M 4/36*    (2006.01)
*H01M 4/583*    (2010.01)
*H01M 4/04*    (2006.01)
*H01M 4/02*    (2006.01)

(52) U.S. Cl.
CPC .......... *H01M 4/483* (2013.01); *H01M 4/0428* (2013.01); *H01M 4/0471* (2013.01); *H01M 4/366* (2013.01); *H01M 4/583* (2013.01); *H01M 2004/027* (2013.01)

(58) Field of Classification Search
CPC ............................. H01M 4/386; H01M 4/134
See application file for complete search history.

(56) References Cited

FOREIGN PATENT DOCUMENTS

| JP | 2004-047404 A | 2/2004 |
| JP | 2012-156055 A | 8/2012 |
| KR | 2011-0040478 A | 4/2011 |

*Primary Examiner* — Stewart Fraser
*Assistant Examiner* — Olatunji Godo
(74) *Attorney, Agent, or Firm* — Saliwanchik, Lloyd & Eisenschenk

(57) ABSTRACT

A camera module is disclosed, the camera module including a PCB (Printed Circuit Board), a base arranged at an upper surface of the PCB, a holder member arranged at an upper surface of the base and formed with a plurality of magnet reception portions, a surface of which facing the base is opened, and a plurality of magnets coupled to the magnet reception portions, wherein the base is formed with a protrusion configured to support a bottom surface of the magnet by being protrusively formed at a position corresponding to an opening of the magnet reception portions.

8 Claims, 6 Drawing Sheets

NEGATIVE ELECTRODE ACTIVE MATERIAL FOR NON-AQUEOUS ELECTROLYTE RECHARGEABLE BATTERY, METHOD OF FABRICATING THE SAME, AND NON-AQUEOUS ELECTROLYTE RECHARGEABLE BATTERY INCLUDING THE SAME

CROSS-REFERENCE TO RELATED APPLICATION

This application claims the benefit under 35 U.S.C. §119 of Korean Application No. 10-2014-0195934, filed Dec. 31, 2014, which is hereby incorporated by reference in its entirety.

BACKGROUND

Field of the Invention

The present invention relates to a negative electrode active material for a non-aqueous electrolyte rechargeable battery, a method of fabricating the same, and a non-aqueous electrolyte rechargeable battery including the same. More specifically, the present invention relates to a negative electrode active material for a non-aqueous electrolyte rechargeable battery, which includes SiOx having an O/Si molar ratio of 0.5 to 1.6, a method of fabricating the same, and a non-aqueous electrolyte rechargeable battery including the same.

Related Art

Recently, according to the remarkable development of portable electronic apparatuses, communications apparatuses, and the like, a development of a rechargeable battery having a high-energy density has been strongly demanded. At present, as a rechargeable battery having a high-energy density, there are a nickel-cadmium battery, a nickel-hydrogen battery, a lithium ion rechargeable battery, a polymer battery, and the like. Among these, since the lithium-ion rechargeable battery has a remarkably longer lifespan and higher capacity than the nickel-cadmium battery and the nickel-hydrogen battery, it shows a strong growth in demand in a power supply market.

As a conventional negative electrode active material of a lithium-ion rechargeable battery, a carbon-based material has been used. As a new negative active material which allows the lithium ion rechargeable battery to have a higher capacity than a conventional lithium ion rechargeable battery, a lithium-boron composite oxide, a lithium-transition metal (V, Fe, Cr, Mo, Ni, etc.) composite oxide, a compound including Si, Ge, or Sn, N, and O, Si particles whose surfaces are covered with carbon layers using a CVD method, etc. have been proposed.

However, although these negative active materials increase charge/discharge capacity to increase an energy density, expansion or contraction may increase during adsorption or release of lithium ions. Thus, the lithium ion rechargeable battery using these negative active materials has insufficient retention of discharge capacity due to repeated charge and discharge (hereinafter, referred to as "cycle characteristics").

Recently, it has been tried to use a silicon oxide powder represented by SiOx (0<x≤2), such as SiO, as the negative active material. Although silicon oxide may be represented as SiOx, it has a structure in which amorphous silicon and crystalline silicon having sizes of several tens of nanometers are dispersed in silicon dioxide when observed using a transmission electron microscope (TEM) analysis. Thus, SiOx has battery capacity smaller than that of silicon, but 5 to 6 times greater than that of carbon, experiences a relatively low volume expansion, and is easy to be used as a negative active material. However, since SiOx has a large irreversible capacity and very low initial efficiency of about 70%, there are problems in that it requires excessive battery capacity for a positive electrode and thus a large amount of materials for the positive electrode when a battery is actually fabricated using SiOx. Accordingly, SiOx is economically infeasible and it is difficult to increase battery capacity corresponding to 5 to 6 times capacity increase per active material.

In Patent Document 1, a carbon film is formed on a surface of a particle (a conductive silicon composite) having a structure in which crystalline silicon is dispersed in silicon dioxide. However, there is a limit to increase the initial efficiency.

In Patent Document 2, a film including lithium fluoride is formed on a surface of SiOx in order to suppress cracks or defects of a negative electrode active material for a non-aqueous electrolyte rechargeable battery, which is confirmed by XPS analysis. However, aside from improved cycle characteristics of the battery, whether or not the initial efficiency is improved is not disclosed.

In Patent Document 3, a binding energy value of silicon and oxide is represented by a ratio of a core formed of SiOx to a shell including a metal oxide layer. However, aside from improved thermal stability and cycle characteristics of the battery, whether or not the initial efficiency is improved is not clearly disclosed.

CITATION LIST (Paten Document 1) Japanese Patent Published Number 2004-047404.

(Paten Document 2) Japanese Patent Published Number 2012-156055.

(Paten Document 3) Korea Patent Published Number 10-2011-0040478.

BRIEF SUMMARY

The present invention is directed to a negative electrode active material for a non-aqueous electrolyte rechargeable battery, wherein when SiOx having a molar ratio of oxygen to silicon (O/Si) of 0.5 to 1.6 is evaluated by x-ray photoelectron spectroscopy (XPS) analysis, at least one XPS peak representing Si—O binding energy exists in the range of 98 to 108 eV, and a ratio of P1 to P2 (P1/P2) is in the range of 2.5 to 20, wherein P1 is defined as the maximum binding energy peak value at 102 to 105 eV and P2 is defined as the maximum binding energy peak value at 98 to 101 eV, a method of fabricating the same, and a non-aqueous electrolyte rechargeable battery including the same.

According to an aspect of the present invention, there is provided a negative electrode active material for a non-aqueous electrolyte rechargeable battery, wherein when SiOx having a molar ratio of oxygen to silicon (O/Si) of 0.5 to 1.6 is evaluated by x-ray photoelectron spectroscopy (XPS) analysis, at least one XPS peak representing Si—O binding energy exists in the range of 98 to 108 eV, and a ratio of P1 to P2 (P1/P2) is in the range of 2.5 to 20, wherein P1 is defined as the maximum binding energy peak value at 102 to 105 eV and P2 is defined as the maximum binding energy peak value at 98 to 101 eV.

In some embodiments, the SiOx may have a structure in which crystalline silicon is dispersed in silicon dioxide, and a crystallite size of the crystalline silicon estimated by the Scherrer equation based on 2-theta of a diffraction peak from a Si (111) plane in an X-ray diffraction analysis may be in the range of 1 to 30 nm.

In other embodiments, an average particle size (D50) of the SiOx may be in the range of 0.1 to 20 μm.

In other embodiments, a specific surface area of the SiOx may be in the range of 0.5 to 100 m2/g.

In other embodiments, the negative electrode active material for a non-aqueous electrolyte rechargeable battery may further include a coating layer or a deposition layer containing a carbon-based material on a surface of the SiOx.

In other embodiments, a content of the carbon-based material per 100 parts by weight of the SiOx may be in the range of 1 to 30 parts by weight.

According to another aspect of the present invention, there is provided a lithium ion battery including the above-described negative electrode active material for a non-aqueous electrolyte rechargeable battery.

According to another aspect of the present invention, there is provided a method of fabricating a negative electrode active material for a non-aqueous electrolyte rechargeable battery including the steps of forming SiOx by performing a first heat treatment on a silicon oxide powder represented by SiOx (0.5≤x≤1.6) in an inert atmosphere or a reducing atmosphere at a temperature of 800° C. to 1400° C. for 30 minutes to 8 hours, and forming a carbon-based material on a surface of the SiOx by performing a second heat treatment on the SiOx in a carbon-containing gas atmosphere or a vapor atmosphere at a temperature of 600° C. to 1200° C. for 30 minutes to 8 hours.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
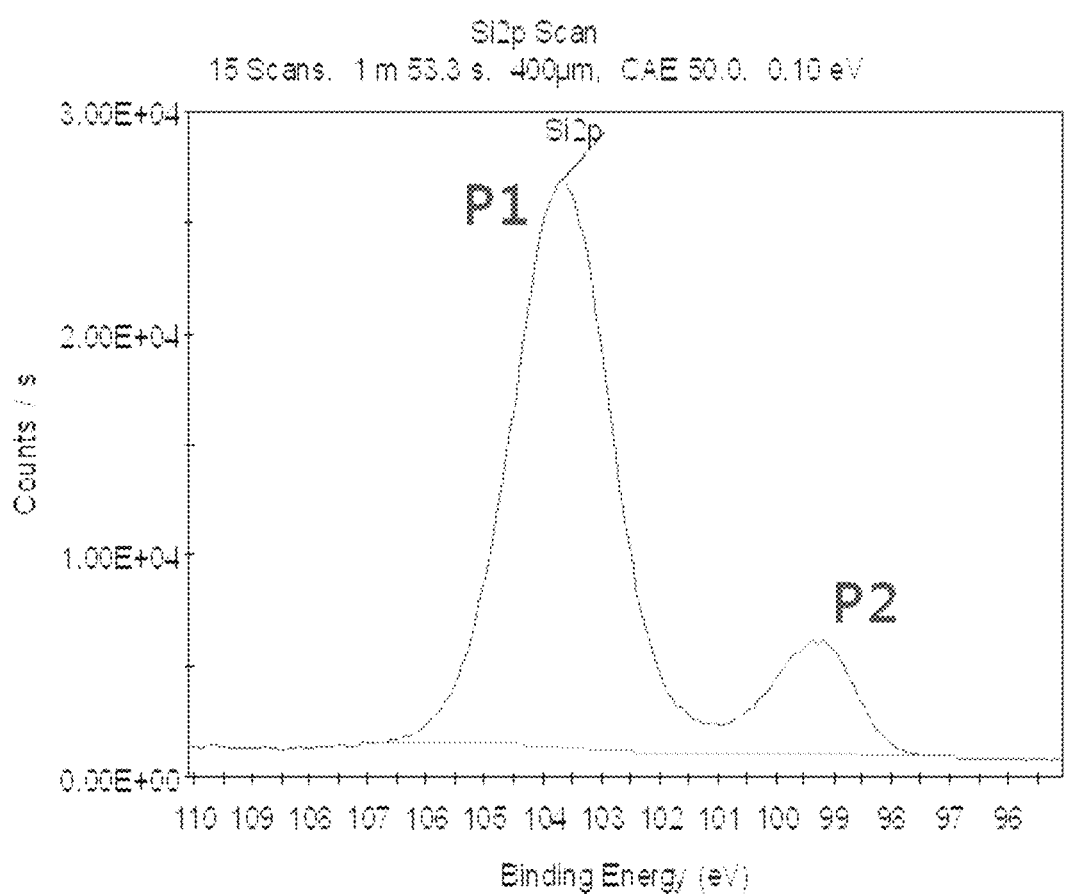
FIGS. 1 to 3 illustrate results of XPS measurements of SiOx of Sample 1, Sample 2, and Sample 3 respectively fabricated according to Exemplary Embodiment 1, Exemplary Embodiment 2, and Comparative Embodiment.

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

It will be understood that when an element or layer is referred to as being "connected to" or "coupled to" another element or layer, it can be connected or coupled to the other element or layer or intervening elements or layers may be present. It will be further understood that the terms "comprises," "comprising," "includes," and/or "including" specify the presence of elements, but do not preclude the presence or addition of one or more other elements.

In a non-aqueous electrolyte rechargeable battery, initial efficiency may be low due to irreversible reactions in which Li2SiO3 and Li2O are generated due to silicon oxide during an initial charging reaction.

Accordingly, inventors of the present invention conducted a heat treatment in order to suppress the above-described irreversible reactions, and repeated related experiments in order to ensure that initial efficiency of the non-aqueous electrolyte rechargeable battery is improved when one or more X-ray photoelectron spectroscopy (XPS) peaks representing the Si—O binding energy appear in a predetermined range and a ratio of binding energy peak values shown in two distinct value ranges in an XPS analysis is within a specific value range.

Hereinafter, embodiments of the present invention will be described in detail with reference to the accompanying drawings.

In order to achieve the above-described objects, according to an embodiment of the present invention, a negative electrode active material for a non-aqueous electrolyte rechargeable battery may be provided, wherein when SiOx having a molar ratio of oxygen to silicon (O/Si) of 0.5 to 1.6 is evaluated by XPS analysis, at least one XPS peak representing Si—O binding energy exists in the range of 98 to 108 eV, and a ratio of P1 to P2 (P1/P2) is in the range of 2.5 to 20, wherein P1 is defined as the maximum binding energy peak value at 102 to 105 eV and P2 is defined as the maximum binding energy peak value at 98 to 101 eV.

A molar ratio of oxygen to silicon (O/Si) in the SiOx may be preferably in the range of 0.5 to 1.6. When the molar ratio of oxygen to silicon (O/Si) is smaller than 0.5, degradation due to charging and discharging cycles may occur in the lithium ion rechargeable battery and capacitor using a negative electrode active material powder according to the embodiment of the present invention. When the molar ratio of oxygen to silicon (O/Si) is greater than 1.6, the battery capacity may be reduced.

The term "SiOx" used in the disclosure may have an amorphous structure or a structure in which crystalline silicon is dispersed in silicon dioxide. Preferably, the SiOx may have a structure in which crystalline silicon is dispersed in silicon dioxide.

A Si—O binding energy of SiOx may be measured by XPS analysis, and the XPS analysis is performed by irradiating the SiOx particle with X-rays and measuring energy intensity of photoelectrons emitted from the negative electrode active material. The XPS analysis is a surface analysis technique using electrons, which is used to analyze an elemental composition of a surface of a material and chemical state of each element. Electrons of every element have a shell structure, such as a shell K, a shell L, or the like, and inner shell electrons thereof may have a unique energy level (binding energy). 2p electrons of a Si atom used in the embodiment of the present invention may have a binding energy of 99 eV. The binding energy of the inner shell electrons may be obtained by irradiating an element with X-ray and measuring kinetic energy of inner shell electrons emitted by photoelectric effect.

A photoelectron spectrum is drawn as a graph in which a horizontal axis represents a binding energy, and a vertical axis represents a counting rate (counts per second: cps), that is, the number of electrons that reach a detector in a second. The spectrum is configured with a plurality of peaks formed by various electrons, such as low-energy electrons, photoelectrons, and Auger electrons. The photoelectron peak may be usually observed over a background spectrum formed by a number of low-energy electrons. In addition, for a closer look at a specific peak in the embodiment of the present invention, a high resolution spectrum having improved resolution may be obtained by obtaining spectra several times in a narrow range of binding energy in which the peak is located and accumulating the spectra, and a chemical environment or a surface concentration of an element may be seen by analyzing the peak of the high resolution spectrum.

When the SiOx is evaluated by XPS analysis, a negative electrode active material for a non-aqueous electrolyte rechargeable battery having at least one XPS peak representing Si—O binding energy in the range of 98 to 108 eV and a ratio of P1 to P2 (P1/P2) in the range of 2.5 to 20 may be obtained. Here, P1 is defined as the maximum binding energy peak value at 102 to 105 eV and P2 is defined as the maximum binding energy peak value at 98 to 101 eV. When material properties of the negative electrode active material for a non-aqueous electrolyte rechargeable battery is beyond the above-described range, the initial efficiency thereof may be decreased. Meanwhile, the peak may be obtained by obtaining five spectra corresponding to oxidation numbers of silicon, that is, 0, +1, +2, +3, and +4 (SiO2), and accumulating them.

The SiOx according to the embodiment of the present invention may have a structure in which crystalline silicon is dispersed in silicon dioxide, and a crystallite size of the crystalline silicon estimated by the Scherrer equation based on 2-theta of a diffraction peak from a Si (111) plane in an X-ray diffraction (XRD) analysis may be in the range of 1 to 30 nm. When the size of crystalline silicon is smaller than 1 nm, the initial efficiency may not be improved due to an irreversible reaction during charging and discharging reactions in the SiOx. When the size of crystalline silicon is greater than 30 nm, cycle characteristics may be degraded due to cracks occurring during volume expansion or contraction.

An average particle size (D50) of the SiOx according to the embodiment of the present invention may be 0.1 to 20 µm. The average particle size of the SiOx may be a value represented as an average weight D50 (a particle diameter or a median diameter when the cumulative weight becomes 50% of the total weight) obtained in a particle size distribution measurement by a laser light diffraction method. When the average particle size (D50) of the SiOx is smaller than 0.1 µm, the negative electrode active material may be non-uniformly distributed since it is difficult to uniformly mix a slurry for the negative electrode of a rechargeable battery due to an increase in specific surface area, efficiency in a process of manufacturing the negative electrode may be reduced since consumption of a binder required for manufacturing the negative electrode increases, and charge/discharge capacity per unit volume may be decreased. Meanwhile, when the average particle size (D50) of the SiOx is greater than 20 µm, it may be difficult to fabricate an electrode layer, and the powder may be easily peeled off from a cathode electrode current collector due to volume expansion of the silicon composite while charging and discharging the rechargeable battery.

The specific surface area of the SiOx according to the embodiment of the present invention may be in a range of 0.5 to 100 m2/g. When the specific surface area of the SiOx is smaller than 0.5 m2/g, a non-uniform electrode layer may be formed during a coating process after fabrication of the slurry. When the specific surface area of the SiOx is greater than 100 m2/g, battery characteristics may be degraded since many side reactions occur inside the battery during charge/discharge reactions.

The SiOx according to the embodiment of the present invention may be in a form of a mixture with a carbon-based material, or may further include a coating layer or a deposition layer containing a carbon-based material on a surface thereof. The carbon-based material may function as an electroconductive agent or suppress cracks occurring in the SiOx (more specifically, crystalline silicon) due to adsorption of lithium.

In addition, the type of the carbon-based material may not be specifically restricted. As the carbon-based material in the form of a mixture, graphite, such as natural graphite, artificial graphite, or expanded graphite, carbon black, such as acetylene black or ketjenblack, or carbon fibers may be used. As the carbon-based material in the form of a coating layer or a deposition layer on the SiOx, a hydrocarbon-based material, such as methane, ethane, ethylene, propane, butane, acetylene, and carbon monoxide, benzene, toluene, or xylene, may be used. Preferably, the carbon-based material may be the form of a coating layer or a deposition layer on the SiOx, since it may increase conductivity of the negative electrode active material.

A content of carbon-based material included in the surface the SiOx according to the embodiment of the present invention may be in the range of 1 to 30 parts by weight per 100 parts by weight of the SiOx. When the content of the carbon-based material is less than to 1 part by weight per 100 parts by weight of the SiOx, conductivity of the electrode, charge/discharge characteristics, and cycle characteristics may not be improved. When the content of the carbon-based material is more than to 30 parts by weight per 100 parts by weight of the SiOx, although there is no problem in the conductivity of the electrode, charge/discharge characteristics, and cycle characteristics, it may be difficult to fabricate the slurry or battery capacity may be reduced since the specific surface area of the electrode increases.

In addition, according to the embodiment of the present invention, a method of fabricating a negative electrode active material for a non-aqueous electrolyte rechargeable battery may be provided. The method may include a first step of forming SiOx by performing a first heat treatment on a silicon oxide powder represented by SiOx ($0.5 \leq x \leq 1.6$) in an inert atmosphere or a reducing atmosphere at a temperature of 800° C. to 1400° C. for 30 minutes to 8 hours, and a second step of forming a carbon-based material on a surface of the SiOx by performing a second heat treatment on the SiOx in a carbon-containing gas atmosphere or a vapor atmosphere at a temperature of 600° C. to 1200° C. for 30 minutes to 8 hours.

In the first step, the silicon oxide powder which has undergone the first heat treatment may be non-uniformized to have two phases of a SiO2 phase and a Si phase depending on temperatures. The non-uniformizing method may be, but not specifically limited to, milling or heating. The milling method may use a V-type mixer, a ball mill art lighter, a jet mill, a vibration mill attritor, a high-energy ball mill, or the like under a vacuum or inert gas atmosphere. Although the heat treatment may further proceed after milling, the heating method may be more preferable in an economic aspect of the process. When the temperature of the first heat treatment is lower than 800° C., it may be difficult to improve the initial efficiency by the heat treatment. When the temperature of the first heat treatment is higher than 1400° C., the crystalline silicon may be excessively grown and cracks may occur in the SiOx structure due to volume expansion or contraction of the crystalline silicon according to adsorption of lithium ions.

In the second step, the carbon-based material may be formed on the surface of the SiOx by performing the second heat treatment on the SiOx at a temperature of 600° C. to 1200° C. for 30 minutes to 8 hours. More specifically, the carbon-based material may be formed on the surface of the SiOx fabricated in the first step, by performing a chemical vapor deposition (CVD) process or mechanical mixing in a hydrocarbon-based gas atmosphere or a vapor atmosphere at a temperature of 600° C. to 1200° C. Preferably, the carbon-based material may be formed by the CVD process. When the temperature of the second heat treatment is lower than 600° C., the carbon-based material may not be formed or may be significantly slowly formed, resulting in a decrease in productivity. When the temperature of the second heat treatment is higher than 1200° C., the carbon-based material may be difficult to be formed since decomposition of a gas source is promoted.

Meanwhile, in the second step, benzene, toluene, xylene, or the like may be used as the source vapor of the carbon-based material, and methane, ethane, ethylene, propane, butane, acetylene, carbon monoxide, or a mixture thereof with a hydrogen gas may be used as the source gas of the carbon-based material.

In addition, according to the embodiment of the present invention, a negative electrode for a non-aqueous electrolyte rechargeable battery including the above-described negative electrode active material for a non-aqueous electrolyte rechargeable battery, and a non-aqueous electrolyte rechargeable battery may be provided.

The negative electrode may be formed of a negative electrode material mixture only, or configured with a negative electrode current collector and a negative electrode material mixture layer disposed thereon. Likewise, a positive electrode may be formed of a positive electrode material mixture only, or configured with a cathode electrode current collector and a positive electrode material mixture layer disposed thereon. In addition, the negative electrode material mixture or the positive electrode material mixture may further include a conductive agent, a binder, or the like.

As a material configuring the negative electrode current collector and a material configuring the positive electrode current collector, materials well-known in the art may be used. In addition, as the conductive agent or the binder added to the negative electrode and the positive electrode, materials well-known in the art may be used.

When the negative electrode is configured with the current collector and an active material layer disposed thereon, the negative electrode may be fabricated by coating a surface of the current collector with a material mixture paste including the silicon composite and the carbon material formed in the second step, and drying it.

The non-aqueous electrolyte may include a non-aqueous solvent and a lithium salt dissolved in the non-aqueous solvent. As the non-aqueous solvent may include a solvent generally used in the art, preferably, including an aprotic organic solvent. The aprotic organic solvent may include cyclic carbonates, such as ethylene carbonates, propylene carbonates, or butylene carbonates, cyclic carboxylic acid esters, such as γ-butyrolactones, γ-valerolactones, or furanones, chain carbonates, such as diethyl carbonates, ethyl methyl carbonates, or dimethyl carbonates, chain ethers such as 1,2-methoxyethanes, 1,2-ethoxyethanes, or ethoxy methoxy ethanes, or cyclic ethers, such as tetrahydrofuran or 2-methyl tetrahydrofuran. These may be mixed to be used alone or in combination.

Hereinafter, exemplary embodiments of the present invention will be described in detail.

The same silicon oxide powder was used in both of the exemplary embodiments and comparative embodiment. Hereinafter, a silicon oxide powder is referred to as a silicon oxide powder (A). Specifications thereof are as follows.

Amorphous silicon oxide powder (SiO1.02, wherein an amorphous state was verified by X-ray diffractometry analysis (CuKα))

BET specific surface area: 4.7 m2/g

Average particle size (D50): 3.3 μm

<Exemplary Embodiment 1>Fabrication of Negative Electrode Material by 2-step Heat Treatment SiOx (Sample 1) in which crystalline silicon is dispersed in silicon dioxide was obtained by cooling after performing a heat treatment on a silicon oxide powder (A) in a tube furnace in an Ar atmosphere at 1,100° C. for 3 hours. A size of the crystalline silicon in the obtained SiOx powder was 7.1 nm, wherein the size of the crystalline silicon was measured by X-ray diffractometry analysis (CuKα).

A SiOx powder containing 3.5% carbon (Sample 1-1) was obtained by performing CVD on the obtained powder in a tube furnace in a mixed gas atmosphere of Ar and CH4 at 1,000° C. for 2 hours. The crystalline silicon in the obtained SiOx powder has a BET specific surface area of 10.1 m2/g and an average particle size (D50) of 4.0 μm. The size of the crystalline silicon measured by X-ray diffractometry analysis (CuKα) was 7.1 nm, which was the same as Sample 1.

<Exemplary Embodiment 2>Fabrication of Negative Electrode Material by 2-step Heat Treatment SiOx (Sample 2) in which crystalline silicon is dispersed in silicon dioxide was obtained by cooling after performing a heat treatment on a silicon oxide powder (A) in a tube furnace in an Ar atmosphere at 1,200° C. for 3 hours. A size of the crystalline silicon in the obtained SiOx powder was 15.2 nm, wherein the size of the crystalline silicon was measured by X-ray diffractometry analysis (CuKα).

A SiOx powder containing 3.4% carbon (Sample 2-1) was obtained by performing CVD on the obtained powder in a tube furnace in a mixed gas atmosphere of Ar and CH4 at 1,000° C. for 2 hours. The crystalline silicon in the obtained SiOx powder has a BET specific surface area of 10.1 m2/g and an average particle size (D50) of 4.5 μm. The size of the crystalline silicon measured by X-ray diffractometry analysis (CuKα) was 15.2 nm, which was the same as Sample 2.

COMPARATIVE EXAMPLE

Fabrication of Negative Electrode Material by Second Heat Treatment with No First Heat Treatment A SiOx powder containing 5.3% carbon (Sample 3-1) was obtained by performing CVD on a silicon oxide powder (Sample 3) in a tube furnace in a mixed gas atmosphere of Ar and CH4 at 1,000° C. for 2 hours. The crystalline silicon in the obtained SiOx powder has a BET specific surface area of 12 m2/g and an average particle size (D50) of 4.2 μm. The size of the crystalline silicon measured by X-ray diffractometry analysis (CuKα) analysis was 4.2 nm.

EXPERIMENTAL EXAMPLE 1

XPS Peak Value, P1/P2 Ratio Calculation, and XRD Analysis

Spectrum intensities of binding energy of Sample 1. Sample 2, and Sample 3 respectively fabricated according to Exemplary Embodiment 1. Exemplary Embodiment 2, and Comparative Example were measured using XPS analysis, and illustrated in FIGS. 1, 2, and 3, respectively. Specific values thereof were listed in Table 1 below.

The XPS analyses were performed using a model K-Alpha spectrometer (Thermo Scientific), and specifications of the model are as follows.

Figure 2:
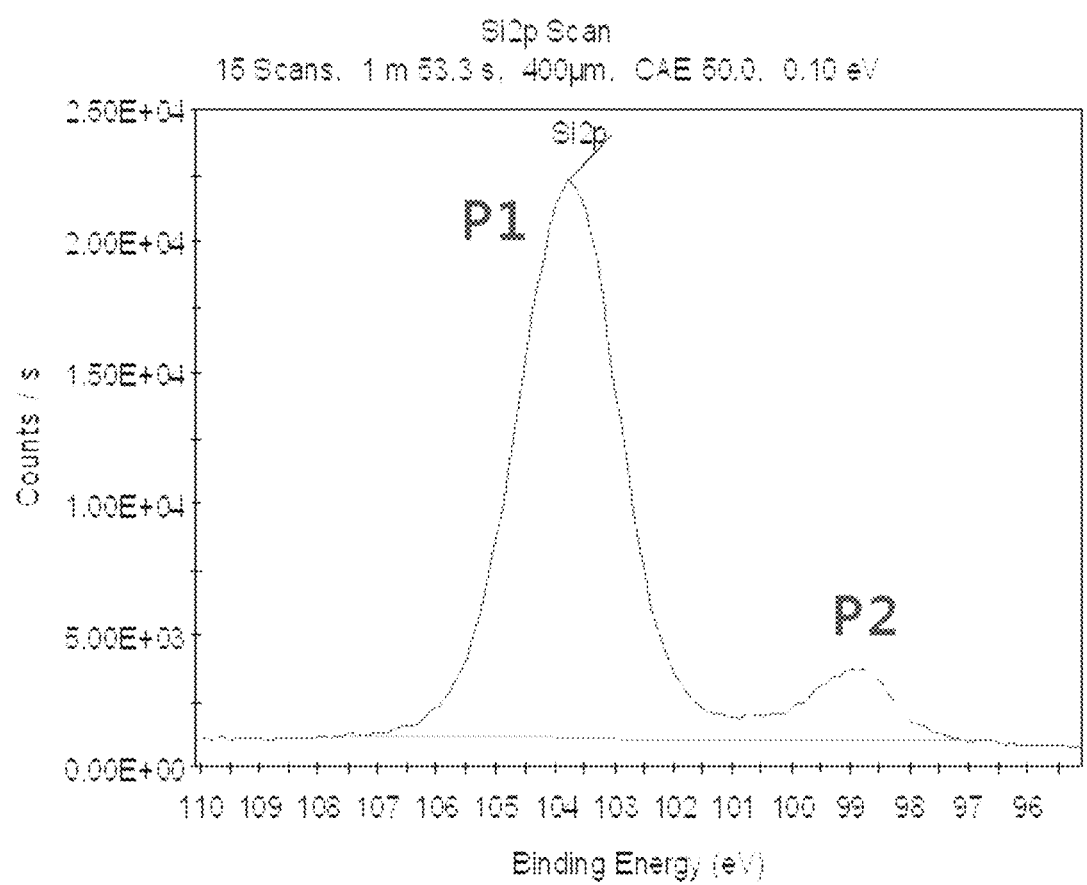
Figure 3:
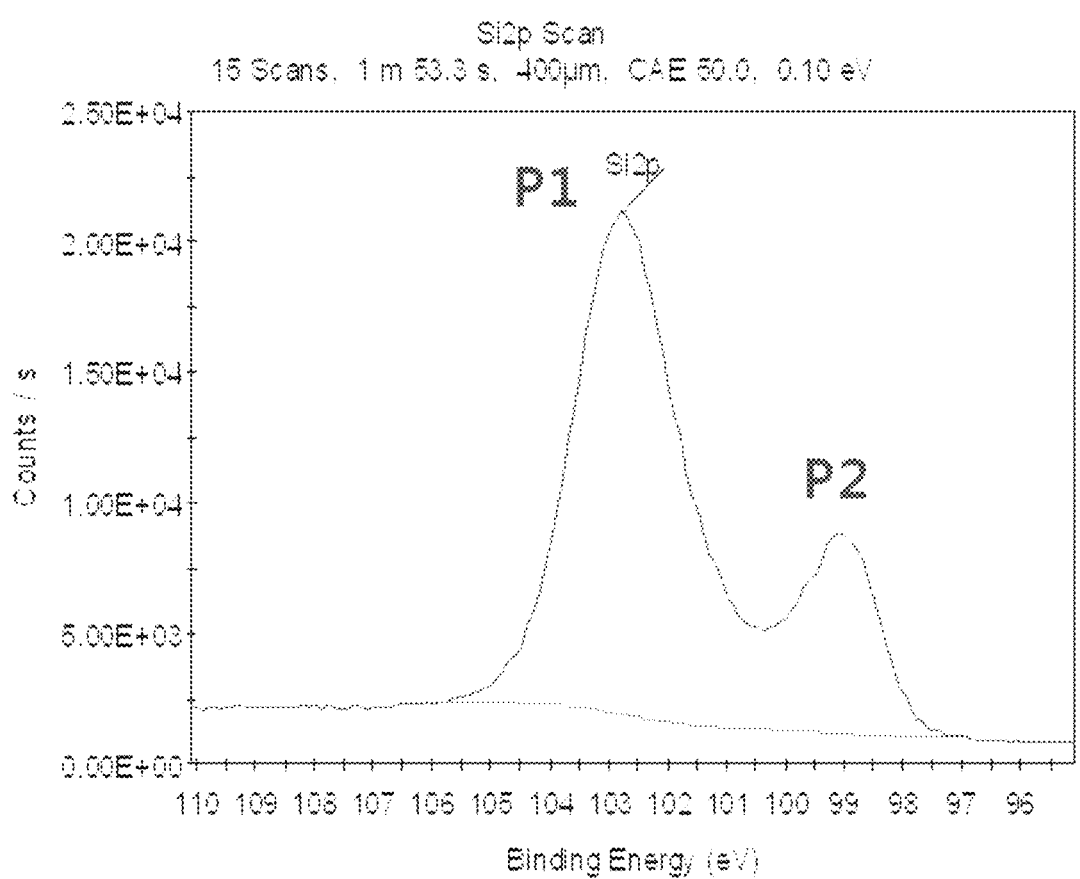

X-ray source: monochromated Al Kα
Spot size: 30 μm to 400 μm
Charge compensation with a flood gun
XPS depth profile
Ion source energy: 100 V to 3 keV FIGS. 1, 2, and 3 illustrate results of the XPS analysis of Exemplary Embodiment 1, Exemplary Embodiment 2, and Comparative Example, which are obtained by accumulating the spectra corresponding to oxidation numbers of silicon, that is, 0, +1, +2, +3, and +4 (SiO2). In addition, as listed in Table 1, the XPS values were measured excluding values of background spectra, wherein P1 represents a peak value of a maximum binding energy shown in a range of 102 to 105 eV, and P2 represents a peak value of a maximum binding energy shown in a range of 98 to 101 eV. Meanwhile, the results may be specifically shown in the following equations.

$P1=P1'$(a peak value of a maximum binding energy shown in a range of 102 to 105 eV)$-B1'$(a background value)

$P2=P2'$(a peak value of a maximum binding energy shown in a range of 98 to 101 eV)$-B2'$(a background value)

Figure 4:
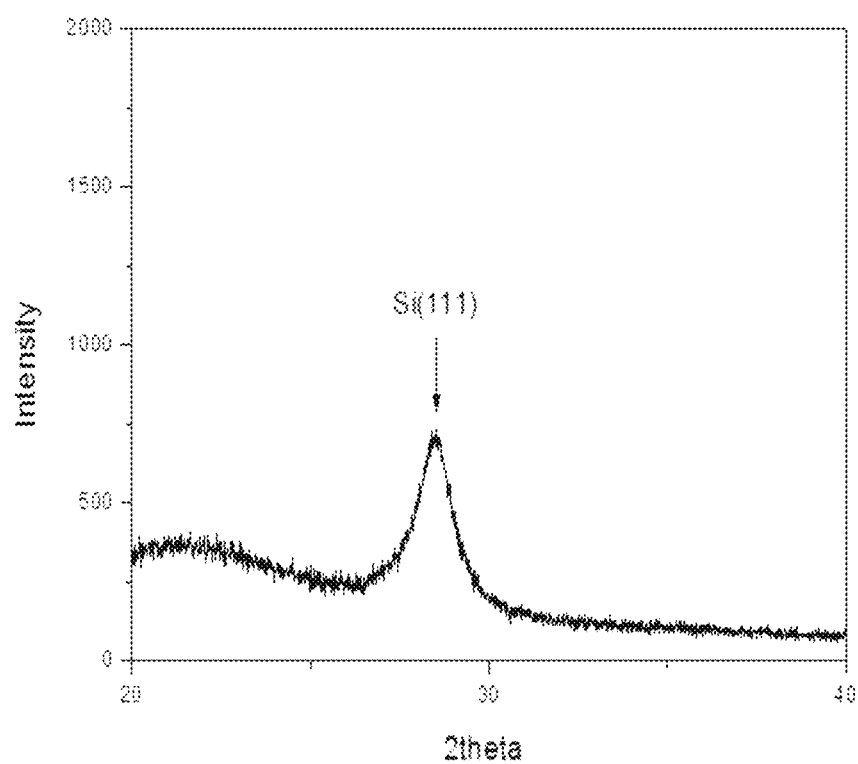
FIGS. 4 to 6 illustrate results of XRD measurements of SiOx of Sample 1, Sample 2, and Sample 3 respectively fabricated according to Exemplary Embodiment 1, Exemplary Embodiment 2, and Comparative Embodiment.
Figure 5:
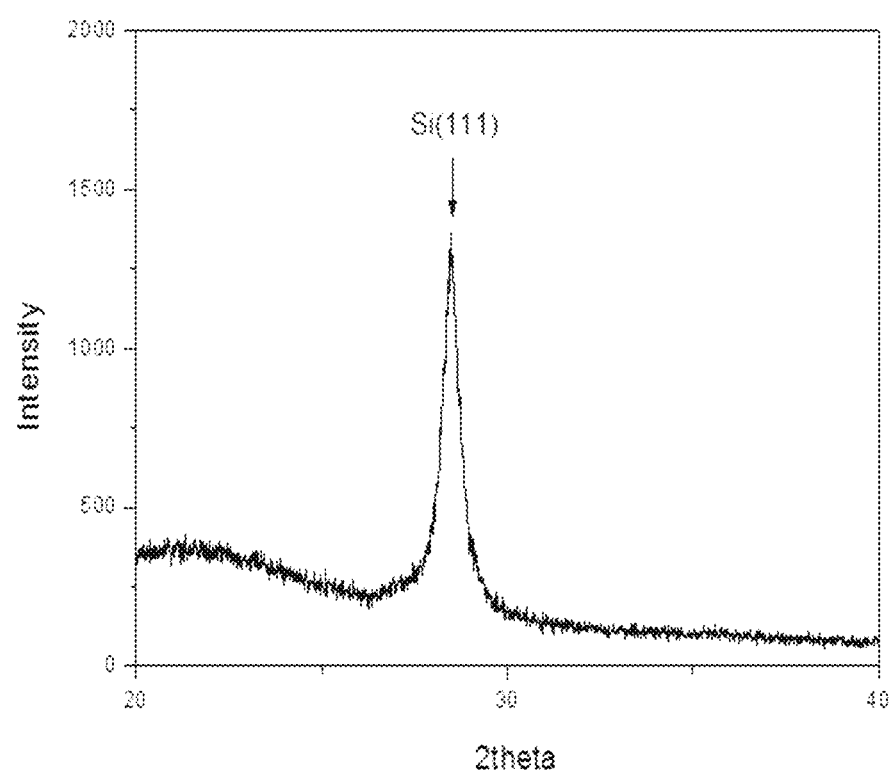
Figure 6:
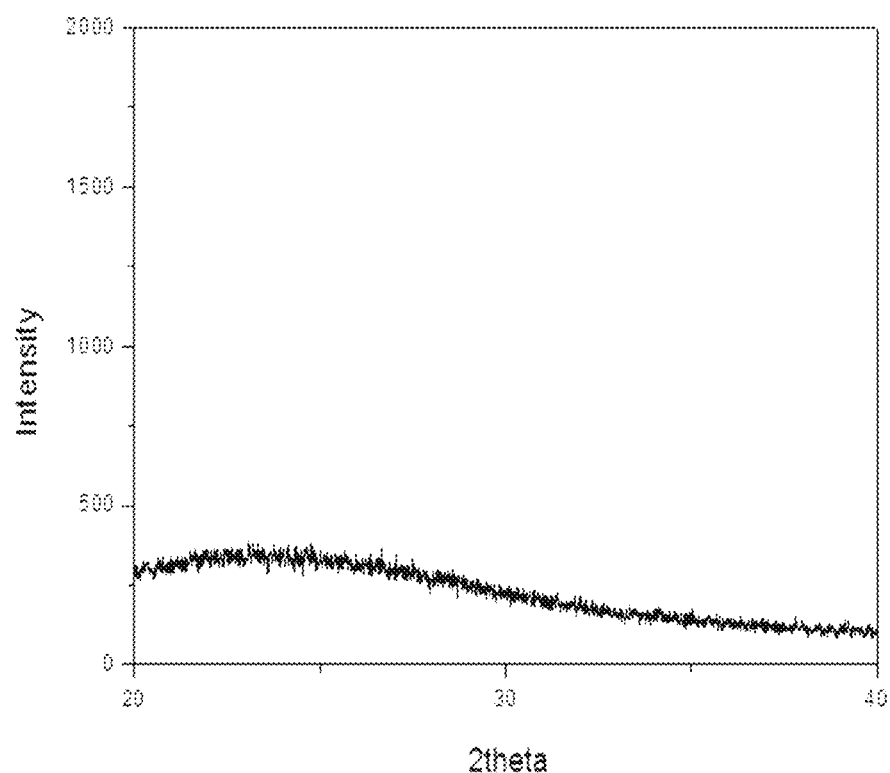

In addition, FIGS. 4, 5, and 6 illustrate results of the XRD analysis of Sample 1, Sample 2, and Sample 3 respectively fabricated in Exemplary Embodiment 1, Exemplary Embodiment 2, and Comparative Example. Sizes of the crystalline silicon were estimated by the Scherrer equation based on 2-theta of a diffraction peak from a Si (111) plane. Specific values thereof are listed in Table 1 below.

In the results of the XRD analysis, sizes of the crystalline silicon were increased in Exemplary Embodiment 1 and Exemplary Embodiment 2 which had undergone the first heat treatment at temperatures of 1.100° C. and 1,200° C., respectively, than in Comparative Example in which the first heat treatment was omitted. Further, the higher the temperature of the heat treatment, the greater the size of the crystalline silicon.

TABLE 1

|  |  |  | Sample 1 of Exemplary Embodiment 1 | Sample 2 of Exemplary Embodiment 2 | Sample 3 of Comparative Example |
|---|---|---|---|---|---|
| XPS Analysis | P1 | P1' | 26971 | 22398 | 20804 |
|  |  | B1' | 1347 | 934 | 1692 |
|  |  | P1 | 25624 | 21464 | 19112 |
|  | P2 | P2' | 6189 | 3707 | 8835 |
|  |  | B2' | 1058 | 777 | 947 |
|  |  | P2 | 5131 | 2930 | 7888 |
|  | P1/P2 |  | 4.99 | 7.33 | 2.42 |
| Size of Crystalline Silicon (nm) |  |  | 7.1 | 15.2 | amorphous |

PREPARATIVE EXAMPLE

Fabrication of Coin Cell

Slurry compositions were prepared by mixing the negative active materials (Sample 1-1, Sample 2-1, and Sample 3-1) respectively fabricated according to Exemplary Embodiment 1, Exemplary Embodiment 2, and Comparative Example, Super-P black (Timcal Co.) as a conductive agent, and poly acrylic acid (PAA, Sigma Aldrich) as a binder in a weight ratio of 80:10:10 with n-methylpyrrolidone.

The composition were coated on a copper foil having a thickness of 18 μm and dried to form an active material layer having a thickness of 30 μm on one side of the copper foil. A test electrode were prepared by punching circular holes having a diameter of 14 φ, and a metal lithium foil having a thickness of 0.3 mm was used as an opposite electrode. A porous polyethylene sheet having a thickness of 0.1 mm was used as a separation layer. LiPF6, a lithium salt, dissolved in a mixed solvent of ethylene carbonate (EC) and diethyl carbonate (DEC) in a volume ratio of 1:1 in a concentration of 1 mol/L was used as an electrolyte. Test coin cells having a normal shape were prepared to have a thickness of 2 mm and a diameter of 32 mm (so called type-2032) by filling a stainless steel vessel with these components.

EXPERIMENTAL EXAMPLE 2

Evaluation of Cell Characteristics

The coin cell of each sample was charged at a constant current of 0.05 C until a voltage thereof becomes 0.01V and discharged at a constant current of 0.05 C until a voltage thereof becomes 1.5V, and initial efficiency thereof was calculated.

As listed in Table 1 below, initial efficiencies were improved in Sample 1-1 and Sample 2-1 respectively fabricated according to Exemplary Embodiment 1 and Exemplary Embodiment 2 in which the first and second heat treatments were performed than in Sample 3-1 fabricated according to Comparative Example in which the first heat treatment was omitted and the second heat treatment was performed.

In addition, Sample 2-1 prepared according to Exemplary Embodiment 2 in which the first heat treatment was performed at the temperature of 1,200° C. has a greater initial efficiency and smaller initial discharge capacity than Sample 1-1 prepared according to Exemplary Embodiment 1 in which the first heat treatment was performed at the temperature of 1,100° C.

TABLE 2

|  | Initial Efficiency (%) (Discharge Capacity/ Charge Capacity) | Initial Discharge Capacity (mAh/g) |
|---|---|---|
| Sample 1-1 of Experimental Embodiment 1 | 76 | 1574 |
| Sample 2-1 of Experimental Embodiment 2 | 79 | 1444 |
| Sample 3-1 of Comparative Example | 74.5 | 1560 |

According to the embodiments of the present invention, when the negative electrode active material is used for a non-aqueous electrolyte rechargeable battery, the initial efficiency of the negative electrode active material may be improved by adjusting conditions of a heat treatment and time.

In addition, since the negative electrode active material according to the embodiments of the present invention has a structure in which crystalline silicon is dispersed in silicon oxide, initial efficiency and a lifespan may be improved.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A negative electrode active material for a non-aqueous electrolyte rechargeable battery, wherein when SiOx having a molar ratio of oxygen to silicon (O/Si) of 0.5 to 1.6 is evaluated by x-ray photoelectron spectroscopy (XPS) analysis, at least one XPS peak representing Si—O binding energy exists in the range of 98 to 108 eV, and a ratio of P1 to P2 (P1/P2) is in the range of 2.5 to 20, wherein P1 is defined as the maximum binding energy peak value at 102 to 105 eV and P2 is defined as the maximum binding energy peak value at 98 to 101 eV; and wherein the SiOx has a structure in which crystalline silicon is dispersed in silicon dioxide, and a crystallite size of the crystalline silicon estimated by a Scherrer equation based on 2-theta of a diffraction peak from a Si (111) plane in an X-ray diffraction analysis is in the range of 1.0 to 15.0 nm, wherein an average particle size ($D_{50}$) of the SiOx is in the range of 4.0 to 4.5 μm.

2. The negative electrode active material for a non-aqueous electrolyte rechargeable battery of claim 1, wherein a specific surface area of the SiOx is in the range of 0.5 to 100 $m^2$/g.

3. The negative electrode active material for a non-aqueous electrolyte rechargeable battery of claim 1, further comprising a coating layer or a deposition layer containing a carbon-based material on a surface of the SiOx.

4. The negative electrode active material for a non-aqueous electrolyte rechargeable battery of claim 3, wherein a content of the carbon-based material per 100 parts by weight of the SiOx is in the range of 1 to 30 parts by weight.

5. A lithium ion battery, comprising the negative electrode active material for a non-aqueous electrolyte rechargeable battery of claim 1.

6. A lithium ion battery, comprising the negative electrode active material for a non-aqueous electrolyte rechargeable battery of claim 2.

7. A lithium ion battery, comprising the negative electrode active material for a non-aqueous electrolyte rechargeable battery of claim 3.

8. A lithium ion battery, comprising the negative electrode active material for a non-aqueous electrolyte rechargeable battery of claim 4.

* * * * *